United States Patent
Erickson et al.

(10) Patent No.: US 7,915,949 B2
(45) Date of Patent: Mar. 29, 2011

(54) IMPLEMENTING EFUSE RESISTANCE DETERMINATION BEFORE INITIATING EFUSE BLOW

(75) Inventors: Karl Robert Erickson, Rochester, MN (US); Phil Christopher Felice Paone, Rochester, MN (US); David Paul Paulsen, Dodge Center, MN (US); John Edward Sheets, II, Zumbrota, MN (US)

(73) Assignee: International Business Machines Corporation, Armonk, NY (US)

( * ) Notice: Subject to any disclaimer, the term of this patent is extended or adjusted under 35 U.S.C. 154(b) by 28 days.

(21) Appl. No.: 12/403,158

(22) Filed: Mar. 12, 2009

(65) Prior Publication Data

US 2010/0232248 A1   Sep. 16, 2010

(51) Int. Cl.
  *H01H 37/76* (2006.01)
  *H01H 85/00* (2006.01)
(52) U.S. Cl. ...................................................... 327/525

(58) Field of Classification Search .......... 327/525–526; 365/225.7

See application file for complete search history.

(56) References Cited

U.S. PATENT DOCUMENTS

| | | | |
|---|---|---|---|
| 6,633,196 B2 * | 10/2003 | Sher | 327/525 |
| 7,218,168 B1 * | 5/2007 | Rahman | 327/540 |
| 7,352,242 B1 * | 4/2008 | Hughes | 330/254 |
| 2005/0151578 A1 * | 7/2005 | Huang et al. | 327/525 |
| 2006/0039209 A1 * | 2/2006 | Kawasaki et al. | 365/189.11 |
| 2010/0014373 A1 * | 1/2010 | Anand et al. | 365/225.7 |

\* cited by examiner

*Primary Examiner* — Quan Tra
(74) *Attorney, Agent, or Firm* — Joan Pennington

(57) ABSTRACT

A method and an eFuse programming circuit for implementing resistance determination of an eFuse before initiating eFuse blow, and a design structure on which the subject circuit resides are provided. An eFuse on a chip is used to set current flow through a known resistor and measure the eFuse resistance. An applied voltage to program selected eFuses on the chip is selected responsive to an identified eFuse voltage value.

17 Claims, 2 Drawing Sheets

IMPLEMENTING EFUSE RESISTANCE DETERMINATION BEFORE INITIATING EFUSE BLOW

FIELD OF THE INVENTION

The present invention relates generally to the data processing field, and more particularly, relates to an eFuse programming method and eFuse programming circuit for implementing effective resistance determination of an eFuse before initiating eFuse blow, and a design structure on which the subject circuit resides.

DESCRIPTION OF THE RELATED ART

Currently electronic Fuses (eFuses) often are used to configure elements after the silicon masking and fabrication process. These fuses typically are used to configure circuits for customization or to correct silicon manufacturing defects and increase manufacturing yield. For example, in very large scale integrated (VLSI) chips, it is common to have eFuses that can be programmed for various reasons. Among these reasons include invoking redundant elements in memory arrays for repairing failing locations or programming identification information.

As used in the following description and claims, it should be understood that the term eFuse means a non-volatile storage element that includes either an antifuse, which is a programmable element that provides an initial high resistance and when blown provides a selective low resistance or short circuit; or a fuse, which is a programmable element that provides an initial low resistance and when blown provides a selective high resistance or open circuit.

eFuses have a limited window of operation. This window size while typically not an issue during wafer test where voltages and temperatures are tightly controlled can become an issue during field programming where both temperature and the voltages are more difficult to control. These variations can result in the initial pre-blown resistance of the fuse changing, which will result in different initial currents during fuse blow. If too little current is applied, the eFuse does not blow completely. If too much current is applied, the eFuse can rupture.

Also the window of operation can shift during the manufacturing lifetime of the product. Therefore, the same voltages that correctly blow fuses during early production may not be the same voltages that cause a perfect blow as the product nears the end of its life.

When an eFuse is blown the final resistance of the eFuse has a distribution depending upon how well electromigration has occurred. How well electromigration occurs depends upon the voltage potential across the eFuse and amount of current through the eFuse.

A need exists for a mechanism for effectively implementing resistance determination of an eFuse before initiating eFuse blow.

SUMMARY OF THE INVENTION

Principal aspects of the present invention are to provide an eFuse programming method and an eFuse programming circuit for implementing effective resistance determination of an eFuse before initiating eFuse blow, and a design structure on which the subject circuit resides. Other important aspects of the present invention are to provide such method, circuit and design structure substantially without negative effect and that overcome many of the disadvantages of prior art arrangements.

In brief, an eFuse programming method and an eFuse programming circuit for implementing resistance determination of an eFuse before initiating eFuse blow, and a design structure on which the subject circuit resides are provided. An eFuse on a chip is used to set current flow through a known resistor to measure the eFuse resistance. Responsive to an identified eFuse voltage value a required voltage is selected to program selected eFuses on the chip.

In accordance with features of the invention, the identified eFuse voltage value is applied to an analog-to-digital converter (ADC). The ADC converts the eFuse voltage value to a digital value. The digital value selects a preset regulator setting stored in a look-up table, and a programmable voltage regulator applies the required voltage to fuse blow circuitry to program selected eFuses on the chip.

BRIEF DESCRIPTION OF THE DRAWINGS

The present invention together with the above and other objects and advantages may best be understood from the following detailed description of the preferred embodiments of the invention illustrated in the drawings, wherein.

DETAILED DESCRIPTION OF THE PREFERRED EMBODIMENTS

In accordance with features of the invention, a method and an eFuse programming circuit for implementing resistance determination of an eFuse before initiating eFuse blow, and a design structure on which the subject circuit resides are provided. The method and the eFuse programming circuit for implementing resistance determination of an eFuse before initiating eFuse blow of the invention ensures reliability of the eFuses. This invention utilizes a self-calibrating circuit to ensure that eFuses retain reliability during field programming where both temperature and the voltages are more difficult to control, and also as a product nears its end of life where different voltages may be required to correctly blow eFuses than during early life of the product.

Figure 1:
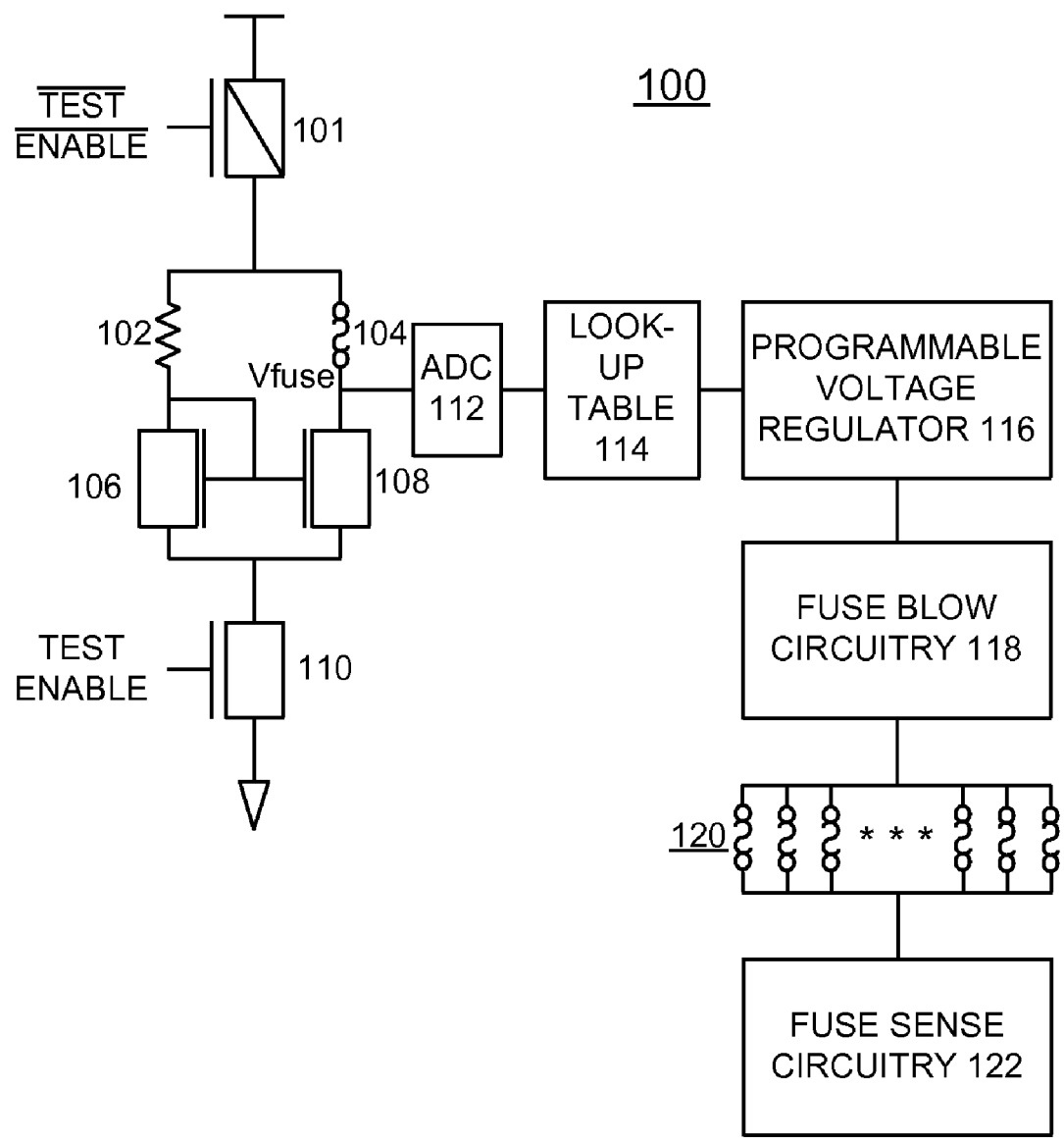
FIG. 1 is a schematic and block diagram representation of an eFuse programming circuit for implementing effective resistance determination of an eFuse before initiating eFuse blow in accordance with the preferred embodiment.

Having reference now to the drawings, in FIG. 1, there is shown an eFuse programming circuit for implementing effective resistance determination of an eFuse before initiating eFuse blow generally designated by the reference character 100 in accordance with the preferred embodiment.

The eFuse programming circuit 100 implements resistance determination of an eFuse before initiating eFuse blow. The eFuse programming circuit 100 includes a first test control transistor or P-channel field effect transistor (PFET) 101 connected between a voltage supply rail VDD, and a common connection of a resistor 102 having a known resistance value and an eFuse 104 on a chip. A control signal TEST ENABLE-bar is applied to a gate of the PFET 101.

A respective one of a pair of N-channel field effect transistors (NFETs) 106, 108 is respectively connected to the opposite end of the known resistor 102 and the eFuse 104. NFETs 106, 108 have a common gate connection that is connected to the known resistor 102. A common drain connection of the NFETs 106, 108 is connected to a source of a second control transistor NFET 110, which has a drain connected to ground potential. A control signal TEST ENABLE is applied to a gate of the NFET 110.

The eFuse 104 is used to set current flow through the known resistor 102 to measure the eFuse resistance. An identified eFuse voltage value at node Vfuse is applied to an analog-to-digital converter (ADC) 112. The ADC 112 converts the eFuse voltage value to a digital value. The digital value selects a preset regulator setting stored in a look-up table 114.

The eFuse programming circuit 100 includes a programmable voltage regulator 116 connected to fuse blow circuitry 118. Fuse blow circuitry 118 is connected to the eFuses 120 on the chip, which are connected to fuse sense circuitry 122.

The programmable voltage regulator 116 applies the required voltage to fuse blow circuitry 118 to program selected eFuses 120 on the chip. The voltages that cause a perfect blow, for example, as the product nears the end of life and during field programming where both temperature and the voltages may vary, by the self-calibrating operation responsive to the initial measurement of the pre-blown resistance of the eFuse 104.

Figure 2:
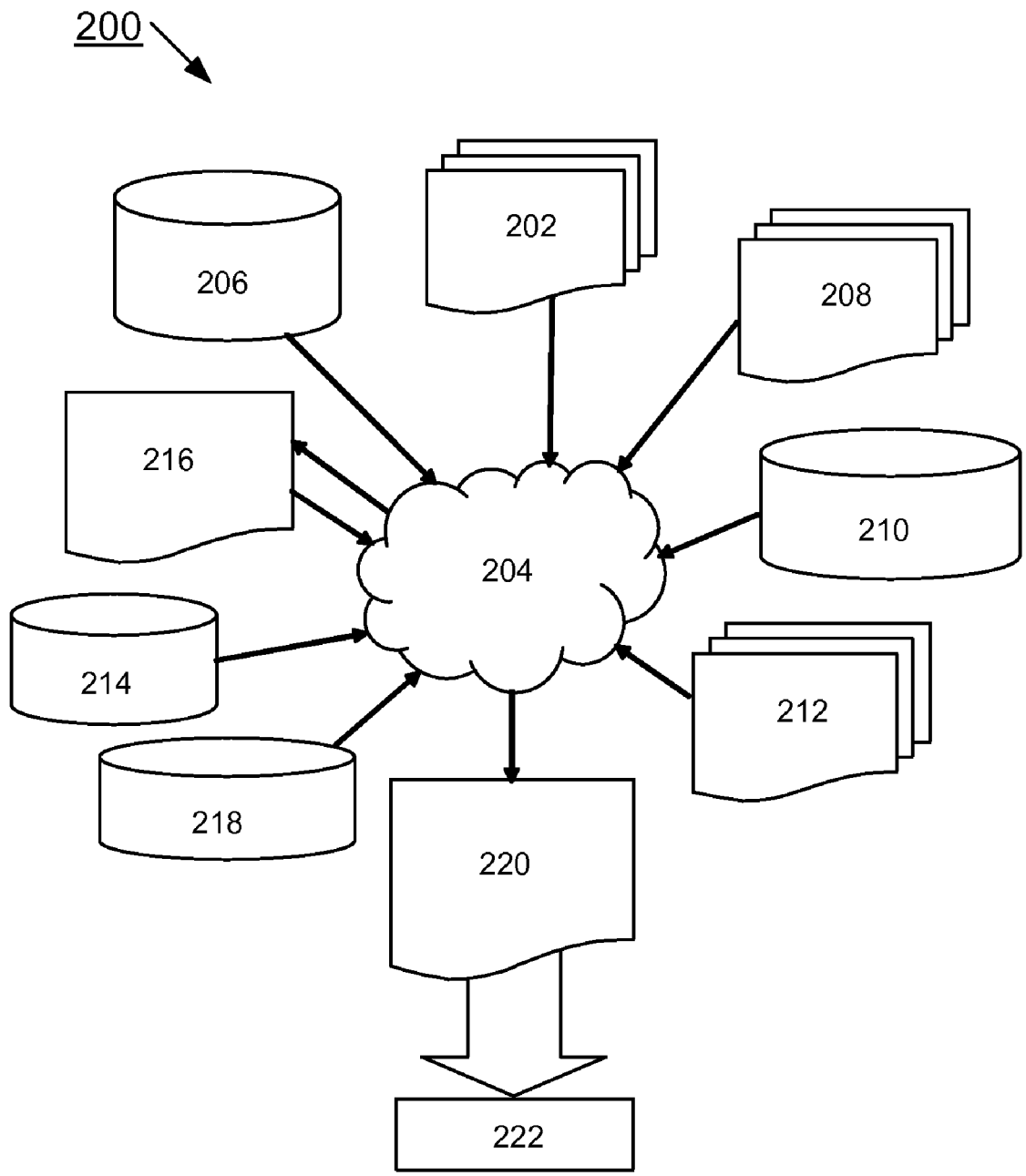
FIG. 2 is a flow diagram of a design process used in semiconductor design, manufacturing, and/or test.

FIG. 2 shows a block diagram of an example design flow 200. Design flow 200 may vary depending on the type of IC being designed. For example, a design flow 200 for building an application specific IC (ASIC) may differ from a design flow 200 for designing a standard component. Design structure 202 is preferably an input to a design process 204 and may come from an IP provider, a core developer, or other design company or may be generated by the operator of the design flow, or from other sources. Design structure 202 comprises circuit 100 in the form of schematics or HDL, a hardware-description language, for example, Verilog, VHDL, C, and the like. Design structure 202 is tangibly contained on, for example, one or more machine readable medium. For example, design structure 202 may be a text file or a graphical representation of circuit 100. Design process 204 preferably synthesizes, or translates, circuit 100 into a netlist 206, where netlist 206 is, for example, a list of wires, transistors, logic gates, control circuits, I/O, models, etc. that describes the connections to other elements and circuits in an integrated circuit design and recorded on at least one of machine readable medium. This may be an iterative process in which netlist 206 is resynthesized one or more times depending on design specifications and parameters for the circuit.

Design process 204 may include using a variety of inputs; for example, inputs from library elements 208 which may house a set of commonly used elements, circuits, and devices, including models, layouts, and symbolic representations, for a given manufacturing technology, such as different technology nodes, 32 nm, 45 nm, 90 nm, and the like, design specifications 210, characterization data 212, verification data 214, design rules 216, and test data files 218, which may include test patterns and other testing information. Design process 204 may further include, for example, standard circuit design processes such as timing analysis, verification, design rule checking, place and route operations, and the like. One of ordinary skill in the art of integrated circuit design can appreciate the extent of possible electronic design automation tools and applications used in design process 204 without deviating from the scope and spirit of the invention. The design structure of the invention is not limited to any specific design flow.

Design process 204 preferably translates an embodiment of the invention as shown in FIG. 1 along with any additional integrated circuit design or data (if applicable), into a second design structure 220. Design structure 220 resides on a storage medium in a data format used for the exchange of layout data of integrated circuits, for example, information stored in a GDSII (GDS2), GL1, OASIS, or any other suitable format for storing such design structures. Design structure 220 may comprise information such as, for example, test data files, design content files, manufacturing data, layout parameters, wires, levels of metal, vias, shapes, data for routing through the manufacturing line, and any other data required by a semiconductor manufacturer to produce an embodiment of the invention as shown in FIG. 1. Design structure 220 may then proceed to a stage 222 where, for example, design structure 220 proceeds to tape-out, is released to manufacturing, is released to a mask house, is sent to another design house, is sent back to the customer, and the like.

While the present invention has been described with reference to the details of the embodiments of the invention shown in the drawing, these details are not intended to limit the scope of the invention as claimed in the appended claims.

What is claimed is:

1. An eFuse programming method for implementing resistance determination of an eFuse before initiating eFuse blow comprising:

using an eFuse on a chip, and a current source to set current flow through a known resistor connected to the eFuse, to identify an eFuse resistance;

measuring an eFuse voltage value responsive to the set current flow by providing an analog-to-digital converter (ADC) connected to the eFuse and applying the identified eFuse voltage value responsive to the set current flow to the analog-to-digital converter (ADC);

responsive to the measured eFuse voltage value, selecting an applied voltage to program selected eFuses on the chip by using the analog-to-digital converter (ADC), converting the eFuse voltage value to a digital value, and using the digital value to select a preset regulator setting; and providing a programmable voltage regulator to apply a required voltage to fuse blow circuitry to program selected eFuses on the chip responsive to said selected preset regulator setting.

2. The eFuse programming method as recited in claim 1 wherein using an eFuse on a chip, and a current source to set current flow through a known resistor connected to the eFuse, to identify an eFuse resistance includes connecting the known resistor and the eFuse together at one end, connecting another end of the known resistor and the eFuse to a respective one of a pair of N-channel field effect transistors (NFETs), said pair of NFETs having a common gate connection that is connected to the known resistor, and having a common drain connection.

3. The eFuse programming method as recited in claim 2 further includes connecting a first test control transistor between a voltage supply rail and the common connection of the resistor and the eFuse, and connecting a second test control transistor between a common drain connection of said pair of NFETs and ground potential.

4. The eFuse programming method as recited in claim 3 further includes applying a respective test enable signal to a gate of said first test control transistor and to a gate of said second test control transistor.

5. An eFuse programming circuit for implementing resistance determination of an eFuse before initiating eFuse blow comprising:

an eFuse resistance measurement circuit including the eFuse on a chip, a known resistor connected to the eFuse, a current source to set current flow through the known resistor and the eFuse, and identify an eFuse resistance of the eFuse;

an analog-to-digital converter (ADC) coupled to the eFuse, said ADC converting an identified eFuse voltage value responsive to the set current flow to a digital value; the digital value being used to select a preset regulator setting; and a programmable voltage regulator applying a required voltage to fuse blow circuitry to program selected eFuses on the chip responsive to said preset regulator setting selected responsive to said digital value.

6. The eFuse programming circuit as recited in claim 5 wherein said eFuse resistance measurement circuit includes the known resistor and the eFuse connected together at one end, a respective one of a pair of N-channel field effect transistors (NFETs) connected another end of the known resistor and the eFuse, said pair of NFETs having a common gate connection that is connected to the known resistor, and having a common drain connection.

7. The eFuse programming circuit as recited in claim 6 wherein said eFuse resistance measurement circuit further includes a first test control transistor connected between a voltage supply rail and the common connection of the resistor and the eFuse, and a second test control transistor connected between a common drain connection of said pair of NFETs and ground potential.

8. The eFuse programming circuit as recited in claim 7 wherein said eFuse resistance measurement circuit further includes a respective test enable signal applied to a gate of said first test control transistor and to a gate of said second test control transistor.

9. The eFuse programming circuit as recited in claim 7 wherein said first test control transistor includes a P-channel field effect transistor (PFET) and said second test control transistor includes an N-channel field effect transistor (NFET).

10. The eFuse programming circuit as recited in claim 5 includes fuse sense circuitry connected to the eFuses on the chip.

11. The eFuse programming circuit as recited in claim 5 includes a look-up table coupled to said analog-to-digital converter (ADC), said look-up table applying said preset regulator setting to said programmable voltage regulator responsive to said digital value.

12. A design structure tangibly embodied in a machine readable medium used in a design process, the design structure comprising:

an eFuse programming circuit tangibly embodied in the machine readable medium used in the design process, said eFuse programming circuit for implementing resistance determination of an eFuse before initiating eFuse blow;

said eFuse programming circuit including an eFuse resistance measurement circuit including an eFuse on a chip, a known resistor connected to the eFuse, a current source to set current flow through the known resistor and the eFuse, and identify an eFuse resistance of the eFuse;

an analog-to-digital converter (ADC) coupled to the eFuse, said ADC converting an identified eFuse voltage value to a digital value responsive to the set current flow; the digital value being used to select a preset regulator setting; and a programmable voltage regulator applying a required voltage to fuse blow circuitry to program selected eFuses on the chip responsive to said preset regulator setting selected responsive to said digital value, wherein the design structure, when read and used in the manufacture of a semiconductor chip produces a chip comprising said eFuse programming circuit.

13. The design structure of claim 12, wherein the design structure comprises a netlist, which describes said eFuse programming circuit.

14. The design structure of claim 12, wherein the design structure resides on storage medium as a data format used for the exchange of layout data of integrated circuits.

15. The design structure of claim 12, wherein the design structure includes at least one of test data files, characterization data, verification data, or design specifications.

16. The design structure of claim 12, wherein said eFuse resistance measurement circuit includes the known resistor and the eFuse connected together at one end, a respective one of a pair of N-channel field effect transistors (NFETs) connected another end of the known resistor and the eFuse, said pair of NFETs having a common gate connection that is connected to the known resistor, and having a common drain connection.

17. The design structure of claim 16, wherein said eFuse resistance measurement circuit further includes a first test control transistor connected between a voltage supply rail and the common connection of the resistor and the eFuse, a second test control transistor connected between a common drain connection of said pair of NFETs and ground potential; and a respective test enable signal applied to a gate of said first test control transistor and to a gate of said second test control transistor.

* * * * *